(12) United States Patent
Schillaci et al.

(10) Patent No.: US 11,024,707 B2
(45) Date of Patent: Jun. 1, 2021

(54) CHARGE BALANCE SEMICONDUCTOR DEVICE, IN PARTICULAR FOR HIGH EFFICIENCY RF APPLICATIONS, AND MANUFACTURING PROCESS THEREOF

(71) Applicant: STMICROELECTRONICS S.R.L., Agrate Brianza (IT)

(72) Inventors: Antonino Schillaci, Messina (IT); Paola Maria Ponzio, Gela (IT); Roberto Cammarata, Aci Catena (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 58 days.

(21) Appl. No.: 16/438,286

(22) Filed: Jun. 11, 2019

(65) Prior Publication Data
US 2019/0386097 A1 Dec. 19, 2019

(30) Foreign Application Priority Data

Jun. 14, 2018 (IT) .................. 102018000006323

(51) Int. Cl.
 *H01L 29/06* (2006.01)
 *H01L 29/66* (2006.01)
 *H01L 29/78* (2006.01)
 *H03F 3/217* (2006.01)

(52) U.S. Cl.
CPC .... *H01L 29/0634* (2013.01); *H01L 29/66712* (2013.01); *H01L 29/7811* (2013.01); *H03F 3/2176* (2013.01); *H03F 2200/451* (2013.01)

(58) Field of Classification Search
CPC .................. H01L 29/157; H01L 29/0619

USPC .................................................. 330/307, 66
See application file for complete search history.

(56) References Cited

U.S. PATENT DOCUMENTS

| 3,919,656 | A | 11/1975 | Sokal et al. |
| 6,228,719 | B1 | 5/2001 | Frisina et al. |
| 6,300,171 | B1 | 10/2001 | Frisina |
| 6,404,010 | B2 | 6/2002 | Saggio et al. |
| 6,586,798 | B1 | 7/2003 | Frisina |

(Continued)

FOREIGN PATENT DOCUMENTS

| CN | 106711189 A | 5/2017 |
| EP | 3306672 A1 | 4/2018 |

OTHER PUBLICATIONS

Sokal, Nathan O. et al., "Class E-A New Class of High-Efficiency Tuned Single-Ended Switching Power Amplifiers," IEEE Journal of Solid-State Circuits, SC-10:3(168-176), Jun. 1975.

(Continued)

*Primary Examiner* — Henry Choe
(74) *Attorney, Agent, or Firm* — Seed IP Law Group LLP

(57) ABSTRACT

A semiconductor MOS device having an epitaxial layer with a first conductivity type formed by a drain region and by a drift region. The drift region accommodates a plurality of first columns with a second conductivity type and a plurality of second columns with the first conductivity type, the first and second columns alternating with each other and extending on the drain region. Insulated gate regions are each arranged on top of a respective second column; body regions having the second conductivity type extend above and at a distance from a respective first column, thus improving the output capacitance $C_{ds}$ of the device, for use in high efficiency RF applications.

22 Claims, 9 Drawing Sheets

(56) References Cited

U.S. PATENT DOCUMENTS

| | | | |
|---|---|---|---|
| 6,677,643 | B2 | 1/2004 | Iwamoto et al. |
| 9,136,381 | B1 | 9/2015 | Kocon et al. |
| 9,368,617 | B2 | 6/2016 | Hirler et al. |
| 9,899,508 | B1 | 2/2018 | Schillaci et al. |
| 10,211,645 | B2 * | 2/2019 | Kato ................. H02J 50/12 |
| 10,580,868 | B2 * | 3/2020 | Bobde ............. H01L 29/0619 |
| 2011/0233714 | A1 | 9/2011 | Lu |
| 2012/0086076 | A1 | 4/2012 | Takei |
| 2013/0149838 | A1 | 6/2013 | Saggio et al. |
| 2015/0145038 | A1 | 5/2015 | Willmeroth et al. |
| 2016/0268369 | A1 | 9/2016 | Ichimura et al. |
| 2017/0018642 | A1 | 1/2017 | Kagata et al. |
| 2017/0288021 | A1 | 10/2017 | Kubo |
| 2018/0158937 | A1 | 6/2018 | Pfirsch et al. |

OTHER PUBLICATIONS

Sokal et al., "Class E—A New Class of High-Efficiency Tuned Single-Ended Switching Power Amplifiers", *IEEE Journal of Solid-State Circuits*, SC-10(3):168-176, 1975.

* cited by examiner

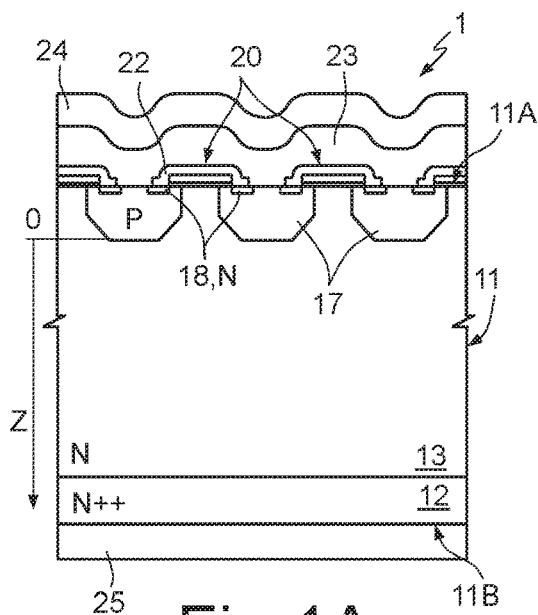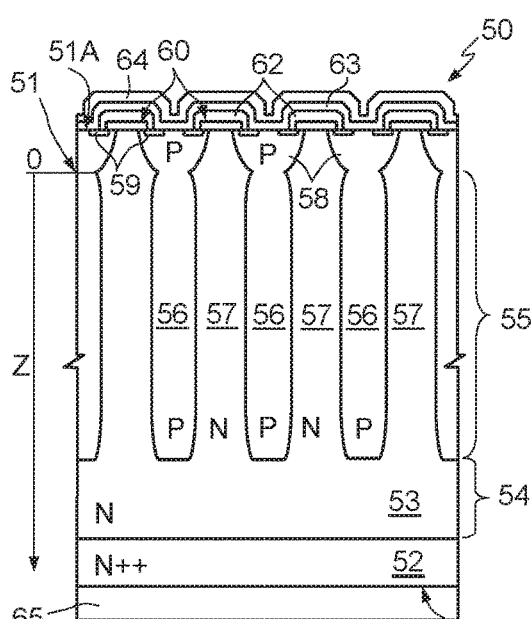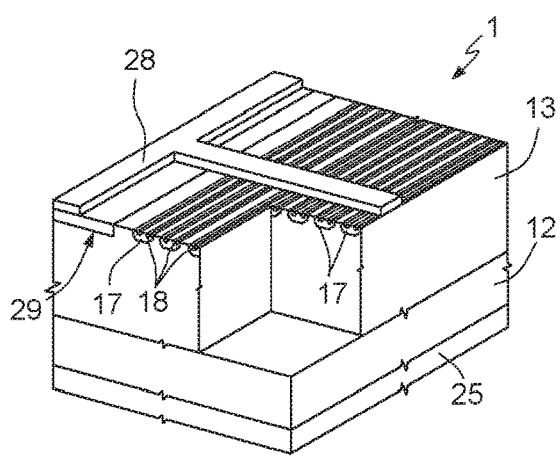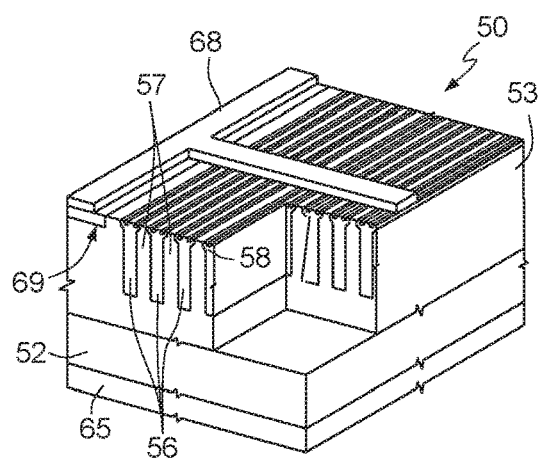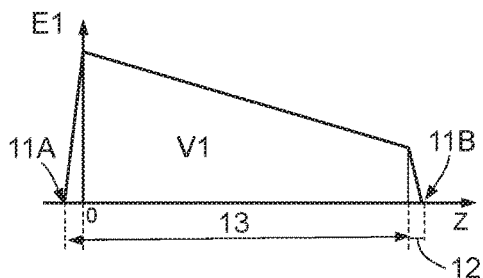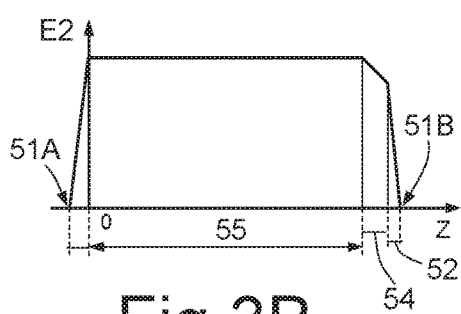

CHARGE BALANCE SEMICONDUCTOR DEVICE, IN PARTICULAR FOR HIGH EFFICIENCY RF APPLICATIONS, AND MANUFACTURING PROCESS THEREOF

BACKGROUND

Technical Field

The present disclosure relates in general to the field of power semiconductor devices, and more in particular to a power MOS device of the charge balance type (also referred to as superjunction device) for high efficiency RF applications, and to the manufacturing process thereof.

Description of the Related Art

As is known, power MOS semiconductor devices may generally be divided between horizontal structure devices and vertical structure devices. Amongst the latter, planar devices and devices having column structures (also referred to as charge balance or superjunction devices) may be distinguished.

Vertical structure devices are shown in FIGS. 1A and 2A (for a power MOS device of a planar type) and in FIGS. 1B and 2B (for a superjunction power MOS device).

With initial reference to FIGS. 1A and 2A (where the regions are not in scale, for sake of clarity), a planar MOS device 1 is integrated in a die comprising a body 11 of semiconductor material. The body 11 has a top surface 11A and a rear surface 11B, and a first conductivity type, for example N. The body 11 is formed by a substrate 12 having a higher doping concentration and by an epitaxial layer 13, less heavily doped. The epitaxial layer 13, forming a drain region, may be formed in a single or in a plurality of growth steps, and accommodates a plurality of body regions 18, here of P type, extending from the top surface 11A of the body 11. Source regions 19, here of N type, extend within the body regions 18 (two source regions 19, arranged at a distance from each other, for each body region 18).

Insulated gate regions 20 (not shown in FIG. 2A) extend on the top surface 11A of the body 11, between adjacent pairs of body regions 18, i.e., laterally offset with respect to the source regions 19. The insulated gate regions 20 are electrically insulated from the body 11, and each is surrounded by a respective insulating region 22. A source metallization 23 (not shown in FIG. 2A) extends over the body 11 and over the insulated gate regions 20, electrically insulated with respect to them by the insulating region 22, and has contact portions extending towards the top surface 11A of the body 11, between adjacent pairs of insulated gate regions 20, in direct electrical contact with the source regions 19. A passivation 24 covers the source metallization 23, and a drain metallization 25 extends on the bottom surface 11B of the body 11.

FIG. 2A shows the elongated shape of the body regions 18, of the source regions 19, as well as of gate biasing regions 28, extending over the insulating regions 22 (not shown) and in electrical contact with the insulated gate regions 20 through vias (not shown), extending through the insulating regions 22. FIG. 2A also shows an edge structure 29 of the planar MOS device 1.

With reference to FIGS. 1B and 2B, a vertical superjunction MOS device 50 is integrated in a die comprising a body 51. The body 51 is of semiconductor material, has a top surface 51A and a rear surface 51B, and a first conductivity type, for example N. The body 51 is typically formed by a substrate 52 having a higher doping concentration and by an epitaxial layer 53, less doped, obtained by successive growths. The epitaxial layer 53 forms a drain region 54 and a drift region 55. The drift region 55 houses a plurality of first columns 56 having a second conductivity type, here P, alternating with second columns 57 of N type, formed by the epitaxial layer 53. Body regions 58, here of P type, extend from the top surface 51A of the body 51 to the top ends of the first columns 56 and accommodate source regions 59, of N type.

Insulated gate regions 60 extend over the top surface 51A of the body 51, between adjacent pairs of body regions 58, i.e., laterally offset with respect to the source regions 59. The insulated gate regions 60 are electrically insulated from the body 51, surrounded each by a respective insulating region 62. A source metallization 63 (not shown in FIG. 2B) extends on the body 51 and on the insulated gate regions 60, is electrically insulated with respect to these by the insulating region 62, and has contact portions extending towards the top surface 51A of the body 51, between adjacent pairs of gate regions 60, in direct electrical contact with the source regions 59. A passivation 64 covers the source metallization 63, and a drain metallization 65 extends on the bottom surface 51B of the body 51.

FIG. 2B further shows the elongated shape of the body regions 58, of the source regions 59, as well as of gate biasing regions 68, extending over the insulating regions 62 (not shown) and in electrical contact with the insulated gate regions 60 through vias (not shown), extending through the insulating regions 62. FIG. 2B also shows an edge structure 69 of the superjunction MOS device 50.

In the planar MOS device 1 of FIGS. 1A and 2A, the epitaxial layer 53 is optimized to provide a suitable breakdown voltage BVDSS (defined as the drain-to-source voltage in presence of a leakage current of 50 nA) and at the same time a low on-resistance RDSon (resistance of the current path in the device, defined as $V_D/I_D$, where $V_D$ is the drain voltage and $I_D$ is the drain current), without the possibility of affecting the relation linking the thickness with the resistivity of the epitaxial layer 53.

In the superjunction MOS device 50, the first columns 56 neutralize the electrical charge in the epitaxial layer 53 (i.e., in the second columns 57) and enable separate optimization of the parameters determining the breakdown voltage BVDSS (thickness and resistivity of the first columns 56), with respect to the values of said parameters in the second columns 57, where the current flows and resistivity may be separately controlled by the design doping level to obtain the desired value of on-resistance RDSon.

In fact, as shown in FIGS. 3A and 3B, the superjunction MOS device 50 affords a better distribution of the electrical field. In particular, FIG. 3A shows the electrical field E1 measured through the epitaxial layer 13 of the planar MOS device 1, in a vertical direction Z from the interface between a body region 18 and the epitaxial layer 13. As may be noted, the electrical field E1 has a descending profile. FIG. 3B shows the electrical field E2 measured through a second column 56 and the drain region 54 of the superjunction MOS device 50, in a vertical direction Z starting from the interface between a body region 57 and the respective second column 56. As may be noted, the electrical field E2 has a constant profile.

Thereby, for a preset value of the breakdown voltage BVDSS and a given size of the dice, it is possible to design the superjunction MOS device 50 so that it has a much lower on-resistance RD Son than the planar MOS device 1 (even one tenth of the values obtainable for the planar power MOS device 1).

This fact renders superjunction MOS devices ideal candidates for applications in radio-frequency apparatuses, which in this way may have a very high power density. However, the use of superjunction MOS devices in radio-frequency applications clashes with the presence of parasitic components preventing operation thereof in real conditions.

For a better understanding of the problem, reference is made to FIG. 4, showing a typical RF circuit that uses a power MOS device of the considered type.

In detail, FIG. 4 shows a class E power amplifier 70, invented by N.O. Sokal in 1975 and described in "Class E—A New Class of High efficiency Tuned Single-Ended Switching Power Amplifiers" by N. and A. Sokal, IEEE Journal of Solid State Circuits (Vol. SC-10, No. 3, June 1975), characterized by extremely high efficiency (i>90%). The power amplifier 70 of FIG. 4 comprises a switching device 71, operating at the carrier frequency of the output signal, and a load network 72, with the task of extracting a single spectral frequency component.

The switching device 71 is typically implemented by a planar MOS device of the type shown in FIG. 1 and has an intrinsic capacitance (referred to hereinafter also as output capacitance $C_{ds}$) between the drain and source terminals. The load network 72 is formed by a capacitor 73 having a capacitance $C_1$, arranged in parallel with the switching device 71, and by an output circuit 74 comprising an LC filter 75 in series configuration. The drain terminal of the switching device 71 is coupled to a d.c. supply voltage $V_{DC}$ through a choke inductor 76.

In the power amplifier 70 of FIG. 4, in order to prevent simultaneous presence of nonzero values of the current $I_{ds}$ and of the voltage $V_{ds}$, which would cause an undesired power dissipation, the waveforms of the current and of the voltage satisfy particular conditions, as discussed in the aforementioned paper by Sokal. In this way, the (normalized) curves shown in FIG. 5 are obtained for the current $I_{ds}$ and the voltage $V_{ds}$.

In the power amplifier 70 of FIG. 4, further, the current $I_{RF}$ flowing in the output circuit 74 is purely sinusoidal, as a result of the ideal behavior of the LC filter 75, forming a series resonant filter and operating at an operating frequency $f_0$.

On this hypothesis, in an ideal condition and to ensure proper operation, the following conditions are desirable:
breakdown voltage BVDSS>$V_{peak}$=3.562 $V_{oc}$;
peak current Ip=2.862 $I_D$c;
maximum frequency $f_{max}$=0.051 $I_{DC}/C_{ds} \cdot V_{DC}$; and
output RF power, which minimizes the losses on the basis of the Sokal conditions, $P_O \approx P_{DC} = V_{DC} \cdot I_{DC} \approx \pi^2 f C_p V_{DC}^2$, where $C_p = C_{ds} + C_1$.

In a superjunction power MOS device it is, however, problematical to satisfy the above conditions.

In fact, one of the features distinguishing a superjunction device resides in the particular plot of the output capacitance $C_{ds}$ as a function of the drain-to-source voltage $V_{ds}$, shown in FIG. 6 (curve A). By comparison, curve B represents the analogous plot of the output capacitance $C_{ds}$ as a function of the drain-to-source voltage $V_{ds}$ of a planar MOS device. As may be noted, curve B has a simple pattern (it is approximately a conic), with a stretch first descending rapidly and then, after a knee, slowly; instead, curve A has an inflection region for voltages comprised between approximately 15 V and 50 V.

A study conducted by the applicant has shown that the plot of the output capacitance $C_{ds}$ of a superjunction device of the type shown in FIG. 2A leads to unacceptable operation in the case of radio-frequency applications. In fact, as shown in FIG. 7, it has been found that the inflection region causes, in the voltage range referred to, the circuit to no longer work at the desired resonance frequency $f_1$=13.56 MHz, but to work around a subharmonic at a frequency that is half of the desired frequency, corresponding to a period of approximately 150 ns. This is shown in FIG. 7, which shows the plot of the drain-to-source voltage $V_{ds}$ for a supply voltage $V_{ic}$=80 V.

BRIEF SUMMARY

One or more embodiments of the present disclosure devise a superjunction power MOS device overcoming the limitations of the prior art and in particular usable in high efficiency radio-frequency applications or in other applications where it is desirable to have a more regular plot of the output capacitance.

According to the present disclosure, a power MOS device and the manufacturing process thereof are provided.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIGS. 1A and 2A are, respectively, a cross-section and a perspective section view of a known power MOS device of a planar type;

FIGS. 1B and 2B are, respectively, a cross-section and a perspective section view of a known power MOS device of a superjunction type;

FIGS. 3A and 3B show the plots of an electrical quantity for the planar power MOS device of FIG. 1A and for the superjunction power MOS device of FIG. 1B, respectively;

DETAILED DESCRIPTION

Figures 8, 9:
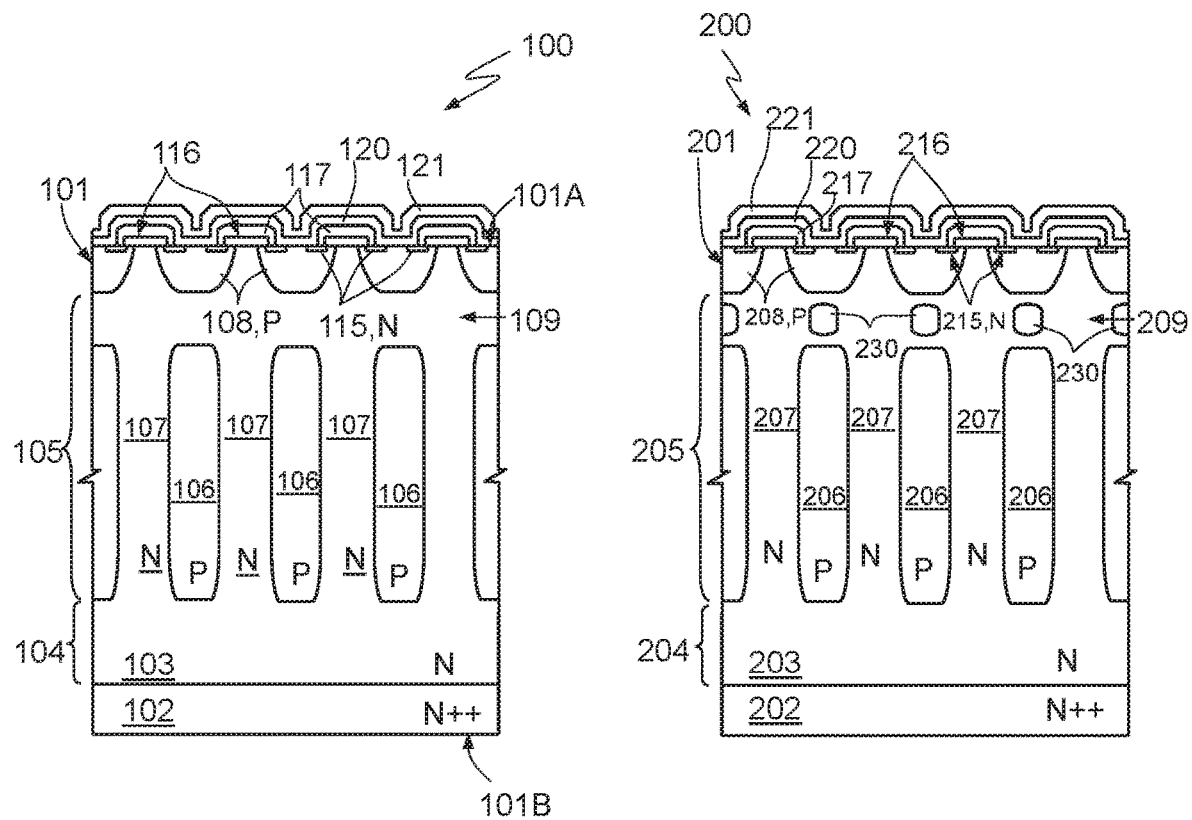
FIG. 8 is a cross-section of an embodiment of the present power MOS device.
FIG. 9 is a cross-section of another embodiment of the present power MOS device.

FIG. 8 shows an embodiment of a superjunction power MOS device, referred to hereinafter also as "device 100".

The device 100 is integrated in a die comprising a body 101. The body 101 is of semiconductor material (such as Si, SiGe, SiC, Ge, GaN, GaAs, AlGaAs, InGaP or other suitable semiconductor material), has a top surface 101A and a rear surface 101B, presents a first conductivity type, for example N. The body 101 is typically formed by a substrate 102 having a higher doping concentration and an epitaxial layer 103, less doped, formed by successive growths. The epitaxial layer 103 forms a drain region 104 and a drift region 105. The drift region 105 accommodates a plurality of first columns 106 having a second conductivity type, here P, alternating with second columns 107 of N type, formed by the epitaxial layer 103. Body regions 108, here of P type, extend from the top surface 101A of the body 101 towards the top ends of the first columns 106, but are separated and terminate at a distance therefrom. Consequently, an interruption portion 109 in the drift region 105 extends between the top ends of the first columns 106 and of the second columns 107 and the bottom of the body regions 108. The interruption portion 109 may have a thickness comprised between 4.5 μm and 7.5 μm; for example, for a device 100 having breakdown voltage of 900 V, it may be equal to 7.5 μm.

As for the planar MOS device 1 and the superjunction MOS device 50 of FIGS. 1A and 1B, each body region 108 accommodates a pair of source regions 115, here of N type, arranged at a distance from each other and facing the top surface 101A of the body 101. Insulated gate regions 116 extend on the top surface 101A of the body 101, between adjacent pairs of body regions 108. In a known way, the insulated gate regions 116 are electrically insulated from the body 101 through a thin gate-oxide layer (not shown) and are each surrounded, at the top and laterally, by a respective insulating region 117. A source metallization 120 extends on the body 101 and on the insulated gate regions 116, is electrically insulated from these by the insulating regions 117, and has contact portions extending towards the top surface 101A of the body 101, between adjacent pairs of insulated gate regions 116, in direct electrical contact with the source regions 115. A passivation 121 covers the source metallization 120, and, in a way not shown, a drain metallization may extend on the bottom surface 101B of the body 101.

In a way not shown, the body regions 108, the source regions 115, and the insulated gate regions 116 may have an elongated shape, as in the superjunction MOS device 50. Further, an edge structure (not shown) may surround the active area where the first and second columns 106, 107 are formed.

The device 100 maintains the charge balance feature of the epitaxial layer 103 (and more in particular, between the second columns 107 and the first columns 106).

By virtue of the interruption portion 109, when the device 100 works at a low voltage (up to 40-50 V), the electrical field in the device 100 does not affect the first columns 106, and the body regions 108 are electrically separated from the first columns 106. Thus, in this area, the device 100 behaves, broadly speaking, like the planar MOS device 1 of FIG. 1A and thus has a low output capacitance $C_{ds}$, with an approximately uniform plot (as discussed hereinafter with reference to FIG. 10). As the voltage grows and as the generated electrical field increases, the latter acts on the first columns 106. Thus, at high voltages the device 100 behaves approximately like the superjunction MOS device 50 of FIG. 1B.

Studies conducted by the present applicant have shown, however, that the device 100 has a deterioration in the voltage strength as compared to the superjunction MOS device 50, showing a reduction of the breakdown voltage BVDSS of almost 50%. This embodiment may be used in applications intended for not high breakdown voltages.

In applications where it is desired to have a higher breakdown voltage BVDSS, it is possible to use the structure of FIG. 9.

FIG. 9 shows another embodiment of the present superjunction power MOS device, referred to hereinafter also as device 200. The device 200 of FIG. 9 has a general structure similar to the device 100 of FIG. 8, and similar elements are identified by the reference numbers increased by 100 and will not be described any further.

The device 200 has a plurality of intermediate regions 230, one for each first column 206, arranged between a respective second column 206 and a respective body region 208, at a distance from both. For instance, each intermediate region 230 may be arranged approximately at the same distance from the respective first column 206 and from the respective body region 208, i.e., at a distance of 1-2 μm from both. The intermediate regions 230 have a conductivity type equal to the first columns 206, here P, and approximately the same doping level, for example between $5.5 \cdot 10^{12}$ and $6.5 \cdot 10^{12}$ at/cm$^3$. Further, the intermediate regions 230 may have a smaller width than the first columns 206, as a result of the manufacturing process, as described below.

By virtue of the separation between the first columns 106, 206 and the respective body regions 108, 208, the devices 100 of FIG. 8 and 200 of FIG. 9 have a better output capacitance $C_{ds}$ than the superjunction MOS device 50 of the type shown in FIG. 1B.

Figure 10:
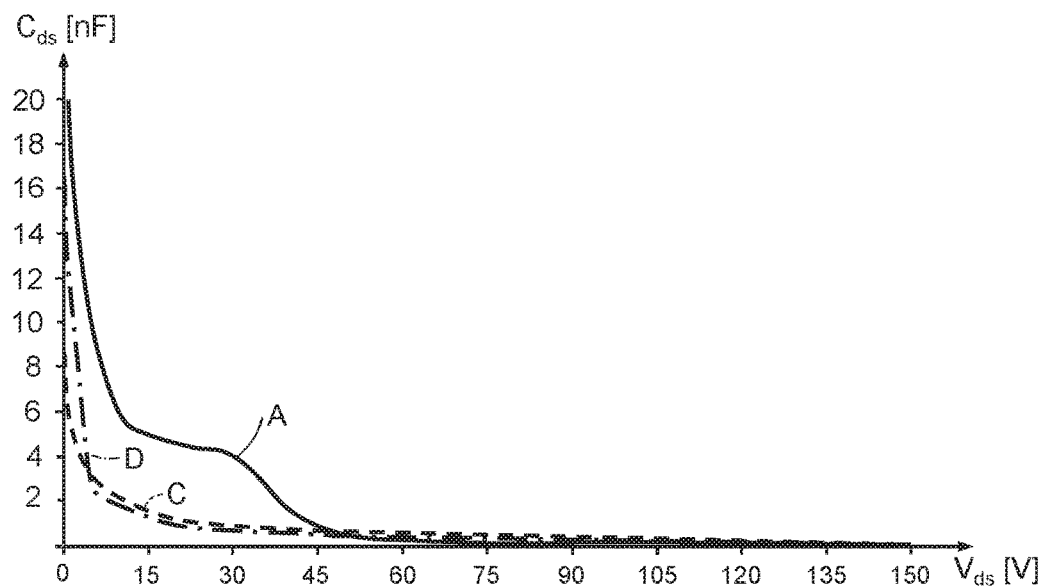
FIGS. 10-12 show plots of electrical quantities for the embodiments of the power MOS devices of FIGS. 8 and 9.

This is visible from the graphs of FIG. 10, which represent the plots of the output capacitance $C_{ds}$ as a function of the drain-to-source voltage Vds for the device 100 (curve C) and for the device 200 (curve D). In this figure, also the curve A of FIG. 6 is plotted, for comparison.

Figure 4:
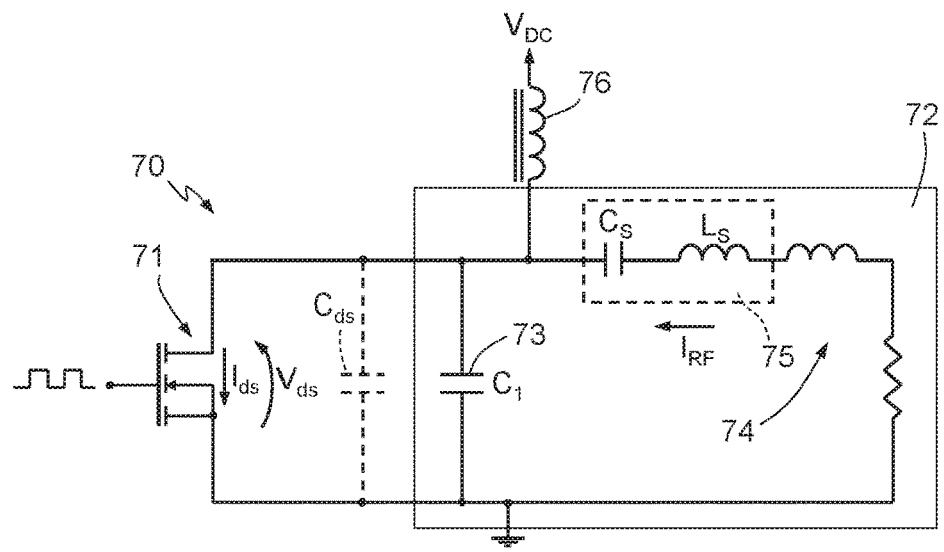
FIG. 4 shows a simplified electrical diagram of a known radio-frequency power amplifier.
Figure 5:
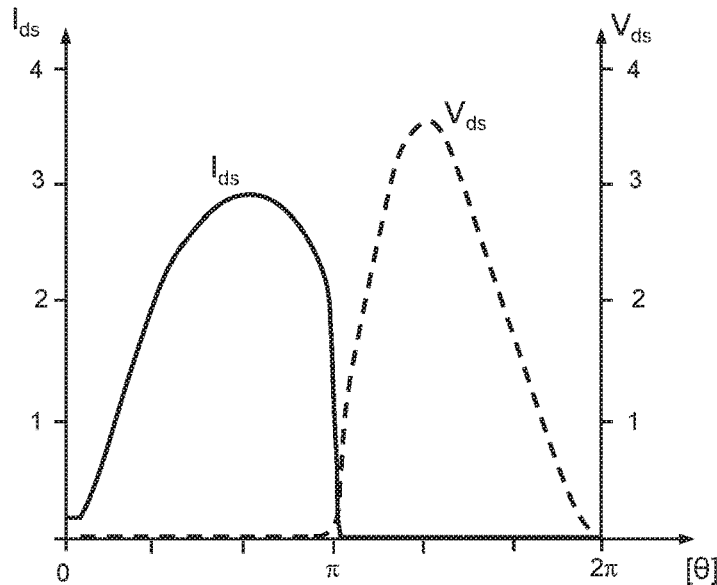
FIGS. 5 and 6 show plots of other electrical quantities for the planar power MOS device of FIG. 1A and for the superjunction power MOS device of FIG. 1B, respectively.
Figure 6:
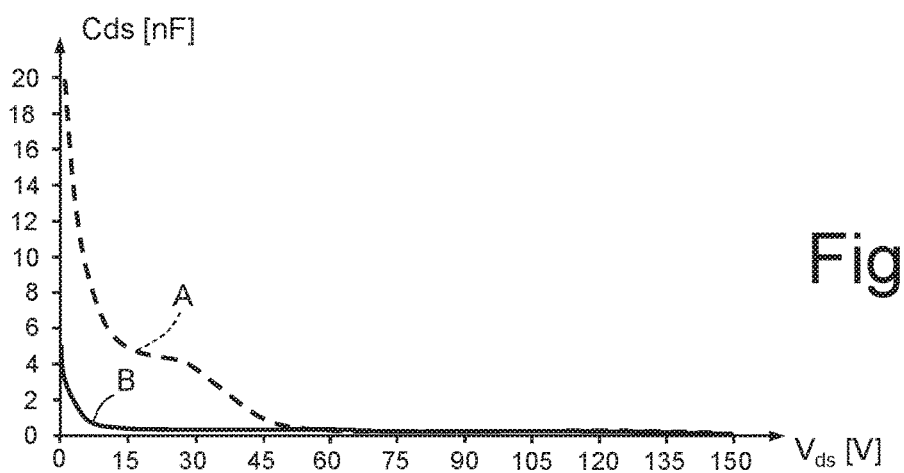
Figure 7:
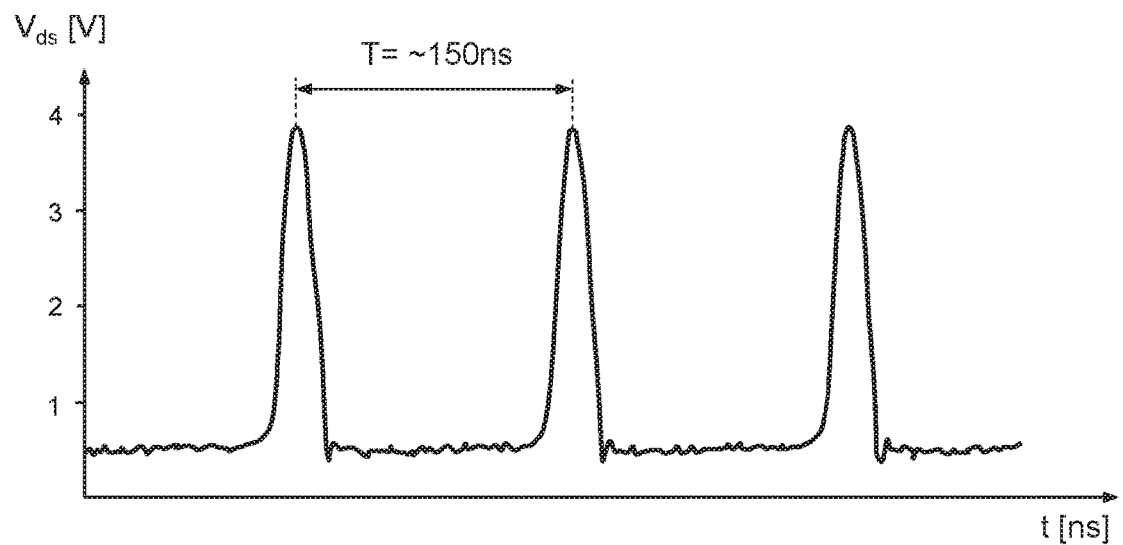
FIG. 7 shows the plot of an electrical quantity for the circuit of FIG. 4 when using the superjunction power MOS device of FIG. 1B.

As may be noted, the curves C and D have a much more uniform plot, similar to that of the curve B of FIG. 6, for planar power MOS device 1, so that they may be used in RF applications, for example for implementing the switching device 71 of FIG. 4.

With the device 200, by virtue of the intermediate regions 230, a better behavior is obtained as regards the breakdown voltage BVDSS.

Figure 11:
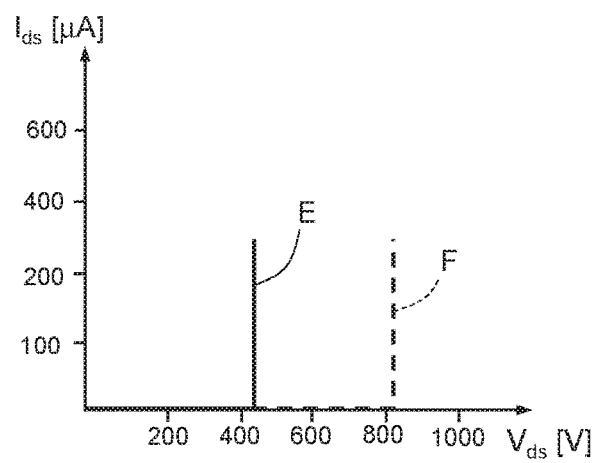

This is visible from FIG. 11, representing the breakdown characteristic Ids/Vds of testing structures made by the present applicant for a device similar to device 200 of FIG. 9 (curve F) and for a device similar to device 100 of FIG. 8 (curve E). As may be noted, all other parameters being the same, the device 200 has a breakdown voltage BVDSS of 854 V, a little lower than similar known superjunction MOS device (900 V-1000 V) and much higher than a corresponding device 100, having a breakdown voltage BVDSS of 443 V.

Further, both the device 100 of FIG. 8 and the device 200 of FIG. 9 have an on-resistance RDSon comparable to the superjunction MOS device 50 of FIG. 1B, since the current path through the second columns 107, 207 is not affected.

Figure 12:
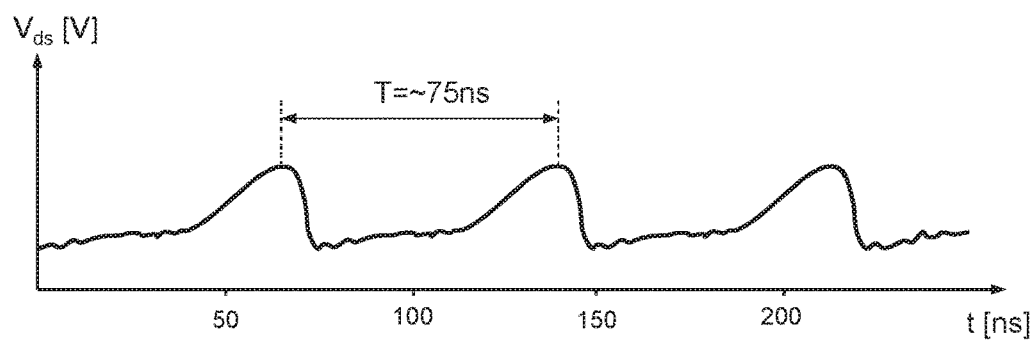

From the testing structures made by the applicant, it has further been found that the present MOS device has the drain-to-source voltage $V_{ds}$ plot represented in FIG. 12 for a supply voltage $V_{DC}$=80 V. As may be noted, the obtained waveform is perfectly compatible with the typical behavior of a class E amplifier of the type shown in FIG. 4, resonating at the fundamental frequency $f_0$=13.56 MHz, corresponding to a period T≈75 ns.

The devices 100 and 200 of FIGS. 8 and 9 are manufactured using initially steps known in the manufacture of superjunction devices, in particular as regards the epitaxial layer 103, 203, the first and second columns 106, 206; 107, 207. The manufacturing process differs only in that the last implantation step of the first columns 106 is not carried out (for the device 100 of FIG. 8) or is carried out to a lesser extent (for the device 200 of FIG. 9), as described in greater detail hereinafter.

FIGS. 13-18 are cross-sections of a semiconductor wafer during successive manufacturing steps of the device 100 of FIG. 8.

Figure 13:
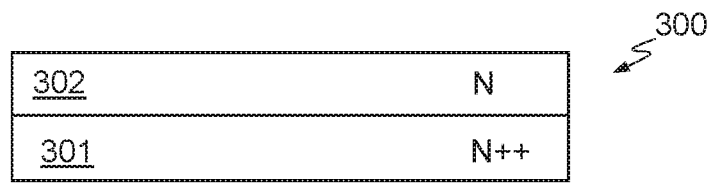
FIGS. 13-19 are cross-sections of a semiconductor wafer in successive manufacturing steps of a power MOS device.

FIG. 13 shows a wafer 300 of semiconductor material comprising a substrate 301, for example silicon of N type, with high doping level (for example, such as to obtain a resistivity comprised between 0.03 and 0.07 Ω·cm). The substrate 301 may correspond to the substrate 102 of FIG. 8. An initial epitaxial sublayer 302 is grown on the substrate 300, also of N type, with a thickness of, for example, 30 µm, a lower doping level than the substrate (for example, to obtain a resistivity comprised between 6 and 16 Ω·cm), in a known way.

Figure 14:
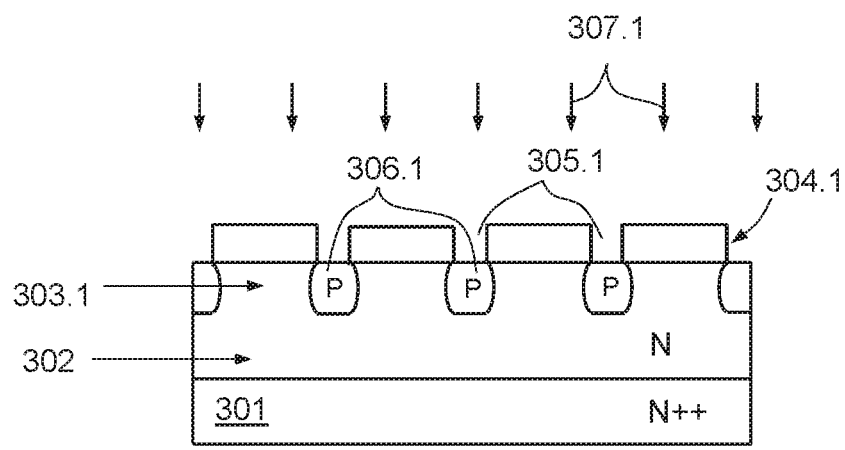

In FIG. 14, a first drift sublayer 303.1, also of N type, is grown on the initial epitaxial sublayer 302 for a thickness of, for example, 4 µm and with a resistivity of 2.5 Ω·cm, and a first masked implant of doping ion species is carried out to generate an opposite conductivity type, here P. In particular, the implant, shown in FIG. 14 by arrows 307.1, enables selective introduction of doping ions, for example boron ions, through a first mask 304.1, for example a resist mask, having openings 305.1 with a first dimension D1, for example a diameter of 4.5 µm. First column portions 306.1 are thus formed in the first drift sublayer 303.1, at a distance from each other, in a known way.

Figure 15:
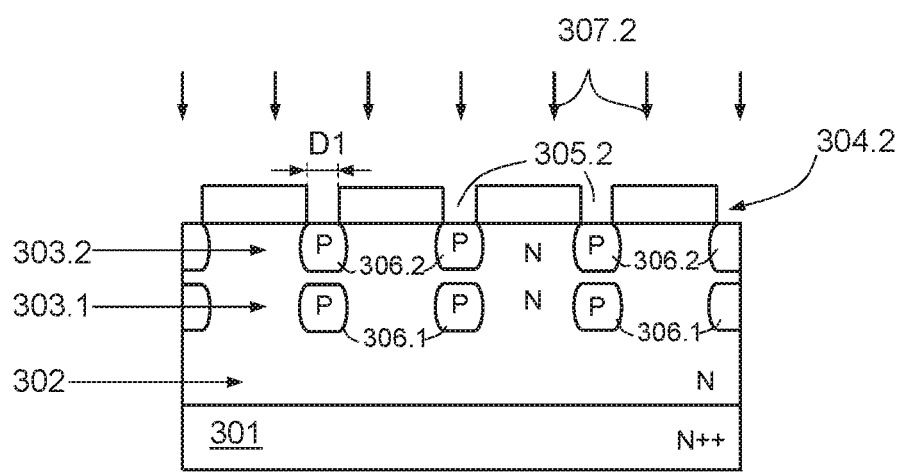

Next, FIG. 15, a third epitaxial growth and a second masked implant are carried out in a known way. A second drift sublayer 303.2 is thus grown on the first drift sublayer 303.1. A second mask 304.2, for example a resist mask, is deposited on the second drift sublayer 303.2 and has second openings 305.2 having the same dimensions as the first openings 305.1 and aligned thereto (thus to the first column portions 306.1). The second drift sublayer 303.2 may have a thickness of, for example, 8 µm and a resistivity slightly higher than the first drift sublayer 303.1, with the same conductivity type, in a known way. The second implant is carried out using the same doping ion species (for example, boron) and leads to formation of second column portions 306.2, vertically stacked on the first column portions 306.1.

Figure 16:
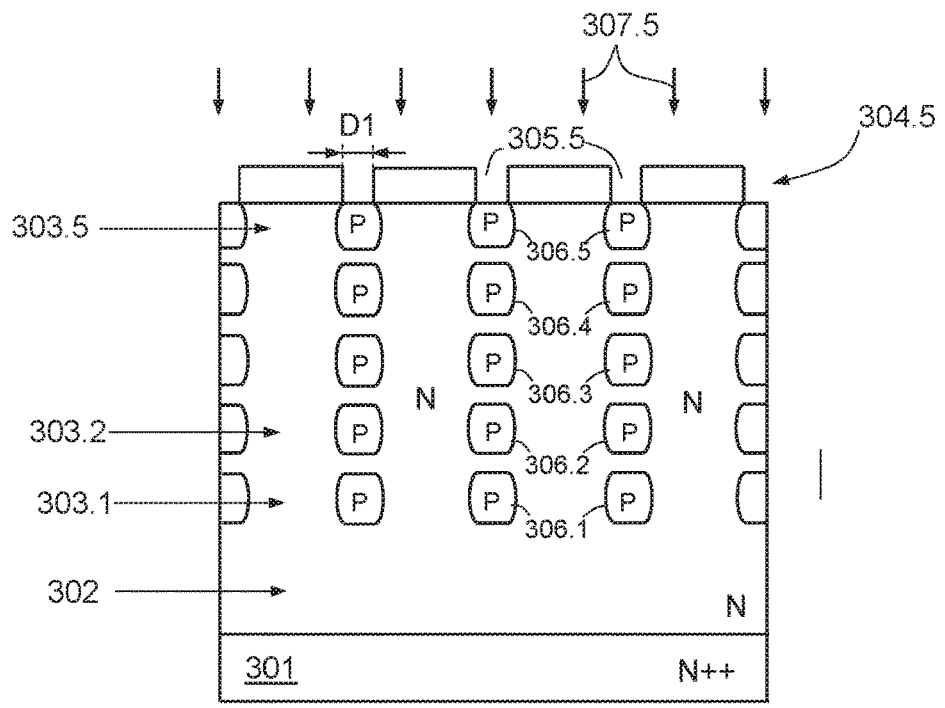

The epitaxial growth and masked implantation steps are repeated a number of times, in the same way, until a plurality of column portions 306.1, 306.2, . . . , 306.n is formed (for example, n=5) mutually aligned in a vertical direction, the total height whereof approximately corresponds to the desired height of the first columns 106, as shown in FIG. 16, where the implant is represented by arrows 307.5 and uses a mask 304.5 having openings 305.5, with the first dimension D1.

Figure 17:
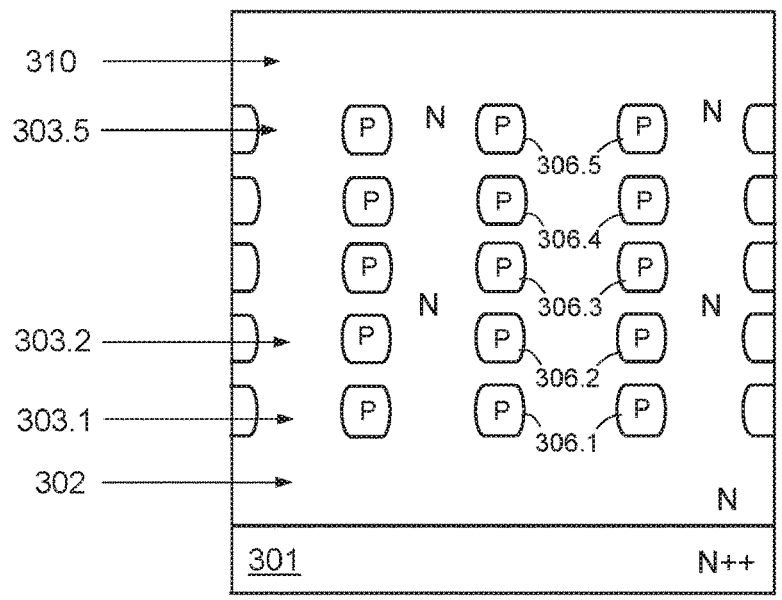

A further epitaxial sublayer 310 is then grown, FIG. 17. In this step, no implantation is made. The further epitaxial sublayer 310 has the same height and the same parameters (thickness, implant energy and concentration) as the drift sublayers 301.2, . . . , 301.5. It should be noted that the final thickness of the further epitaxial sublayer 310, at the end of the manufacturing steps, will be slightly less than the growth value (8 µm), considering diffusion phenomena, in a way known to the person skilled in the art. It should be noted that, in the traditional manufacturing process of a superjunction device, in this step a last column portion (here not present) is formed.

Figure 18:
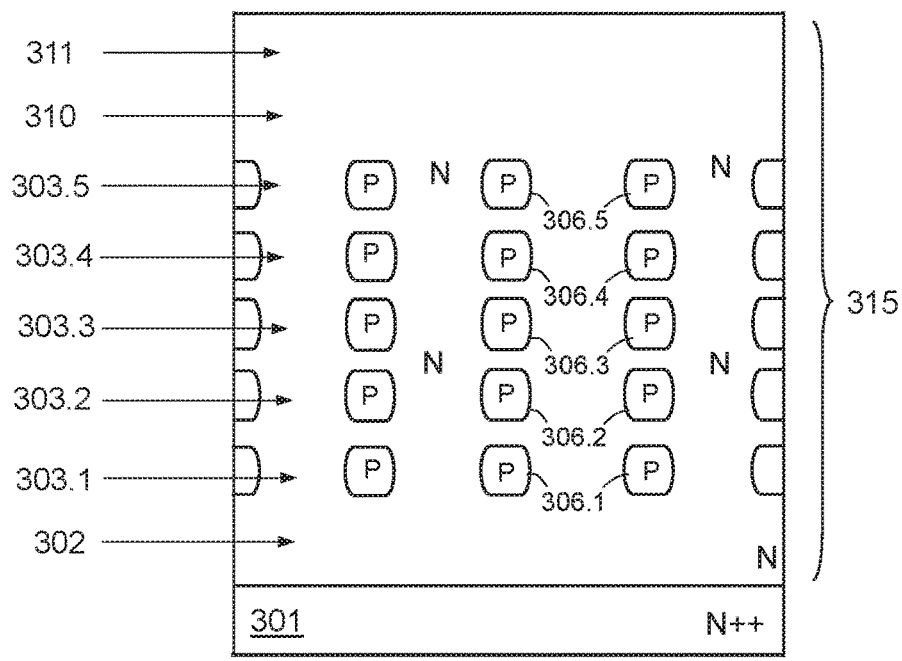

In FIG. 18, a body epitaxial sublayer 311, intended to receive the body regions, is grown on the further epitaxial sublayer 310. The body epitaxial sublayer 311 has the same height and is grown using the same parameters as the further epitaxial sublayer 310 and forms, together with the latter, with the drift sublayers 301.1, 301.2, . . . , 301.5, and with the initial epitaxial sublayer 302, an epitaxial layer 315 corresponding to the epitaxial layer 103 of FIG. 8. Further, the drift sublayers 301.1, 301.2, . . . , 301.5 and the further epitaxial sublayer 310 form a drift region corresponding to the drift region 105, and the initial epitaxial sublayer 302 corresponds to the drain region 104 of FIG. 8.

Figure 19:
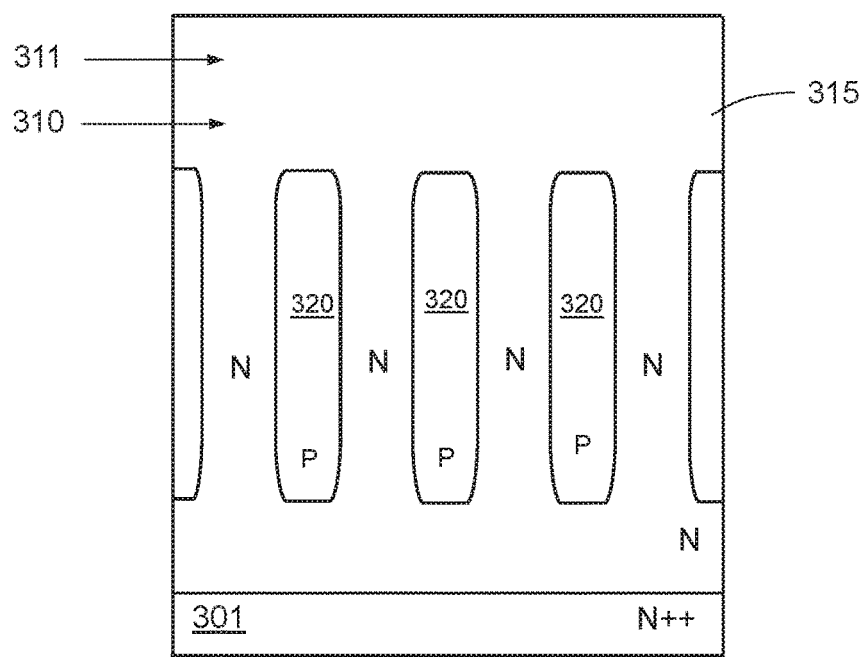

Traditional manufacturing steps then follow, including implantation and diffusion of an edge structure (not shown). In particular, the formation of the edge structure determines diffusion of the doping ion species of the column portions 306.1, 306.2, . . . , 306 and formation of a plurality of first columns 320 (corresponding to the first columns 106 of FIG. 8), extending with continuity through the epitaxial layer 315, as shown in FIG. 19.

In particular, the body regions 108 form in the body epitaxial sublayer 311, without reaching the first columns 106, due to the presence and the thickness of the further epitaxial sublayer 310.

Next, in a way not shown, known ion implantation, deposition, and patterning are carried out to form body, source, and insulated gate regions, and passivations and metallizations (see, for example, U.S. Pat. No. 9,899,508, filed in the name of the applicant, which is incorporated by reference herein in its entirety), to obtain the structure of FIG. 8.

The device 200 of FIG. 9 is manufactured using similar steps to those discussed above, except for the step of FIG. 17. In detail, the manufacturing process of the device 200 comprises the same initial steps as the ones described with reference to FIGS. 13-16, to which reference is made.

Figure 20:
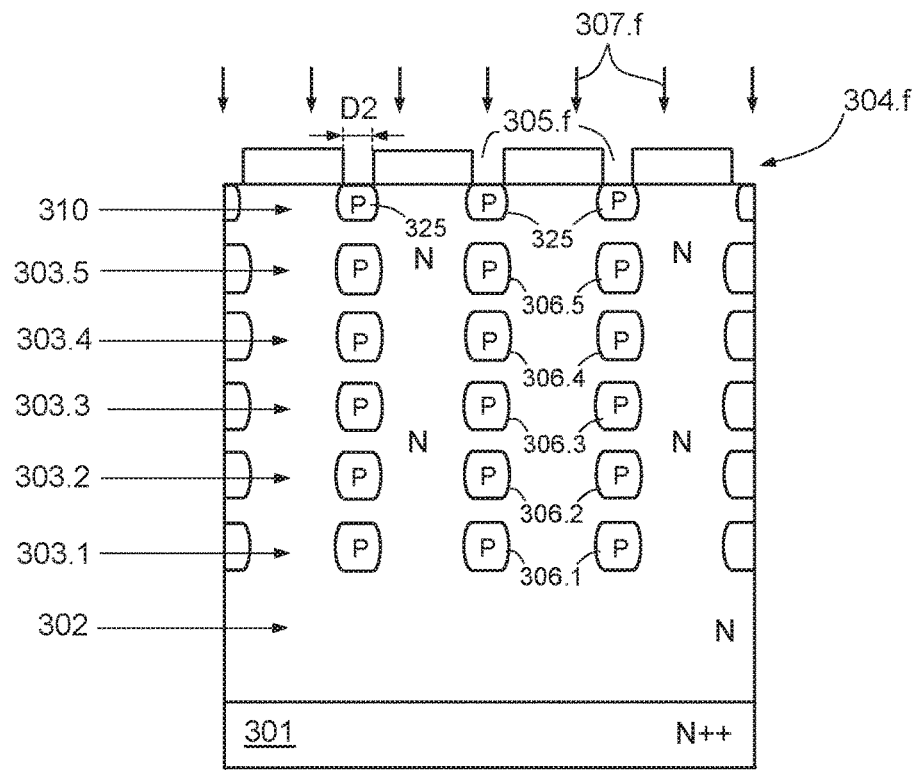
FIGS. 20-22 are cross-sections of a semiconductor wafer in successive manufacturing steps of a different power MOS device.

To obtain the device 200 of FIG. 9, after the step of FIG. 16, the further epitaxial sublayer 310 is grown on the n-th epitaxial sublayer 303.n (here the drift sublayer 303.5 with the column portions 306.5), FIG. 20. As for the step of FIG. 17, the further epitaxial sublayer 310 may be grown using the same parameters as for the n-th epitaxial sublayer 303.n. Further, according to FIG. 20, a final implanting is carried out, as indicated by the arrows 307.f. The final implanting 307.f is carried out with the same doping ion species as the implants 307.1-307.5, but using a mask 304.f having openings 305.f with a dimension D2<D1, for example comprised between 25% and 35% of D2. The energy and concentration of doping atoms for the final implant 307.f may be the same as for the implants 307.1-307.5 or be different, and may be set by simple testing in the design stage, on the basis of the desired final parameters (in particular, the breakdown voltage BVDSS) of the device 9. Implanted regions 325 are thus formed, arranged vertically on top of the first column portions 306.1, but having smaller dimensions than the latter.

Figure 21:
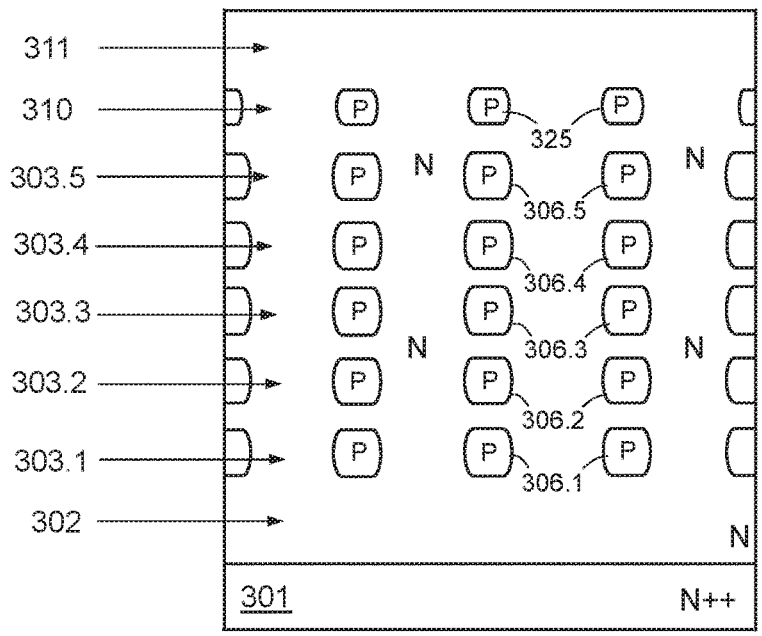

Then, FIG. 21, the body epitaxial sublayer 311, intended to accommodate the body regions 215, as described with reference to FIG. 18, is grown on the further epitaxial sublayer 310. The body epitaxial sublayer 311 has the same height, is grown using the same parameters as the further epitaxial sublayer 310 and forms, together with the latter, with the drift sublayers 301.1, 301.2, . . . , 301.5, and with the initial epitaxial sublayer 302, the epitaxial layer 315 corresponding to the epitaxial layer 203 of FIG. 9. In addition, the drift sublayers 301.1, 301.2, . . . , 301.5 and the further epitaxial sublayer 310 form a drift region corresponding to the drift region 205, and the initial epitaxial sublayer 302 corresponds to the drain region 204 of FIG. 9.

Figure 22:
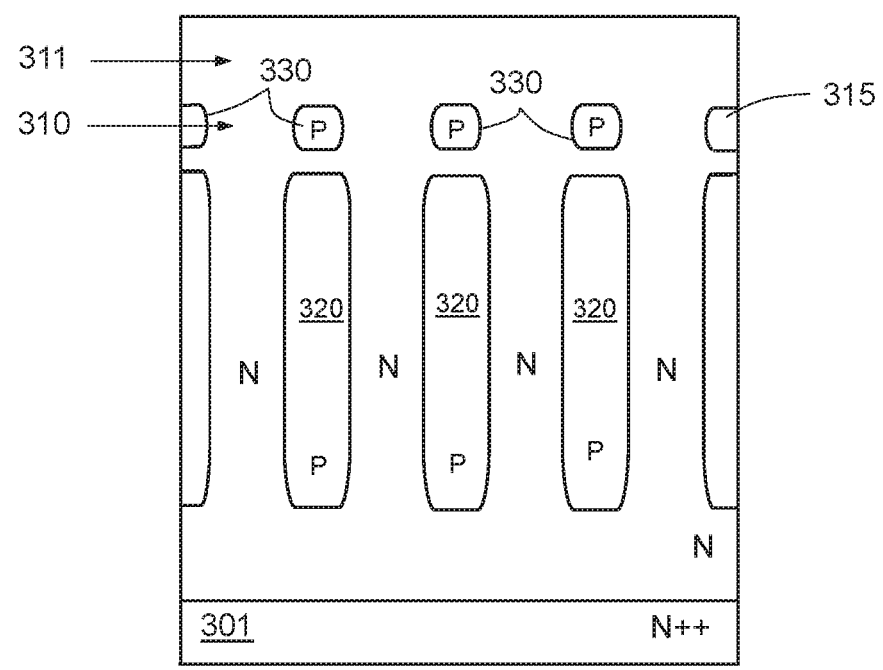

Then traditional manufacturing steps follow, including implanting and diffusing an edge structure (not shown). In particular, forming the edge structure determines diffusion of the doping ion species of the column portions 306.1, 306.2, ..., 306 and formation of a plurality of first columns 320 (corresponding to the first columns 206 of FIG. 9), extending with continuity through the epitaxial layer 315, as shown in FIG. 22. Further, during formation of the edge structure, the doping ion species of the implanted regions 325 also diffuse and form intermediate regions 330 similar to the intermediate regions 230 of FIG. 9, without this diffusion in any case causing connection of the intermediate regions 330 to the first columns 320.

Next, in a way not shown, known steps of ion implantation, deposition, and patterning are carried out for forming body, source, insulated gate regions, and passivations and metallizations (see, for example the structure shown in FIG. 1 of U.S. Pat. No. 9,899,508 in the name of the applicant), to obtain the structure of FIG. 9.

The described power MOS device thus has a better performance as regards high frequency behavior and may thus be used in RF applications, at the expense only of a reduction of the breakdown voltage BVDSS. In particular, according to the envisaged application, it is possible to use the embodiment of FIG. 8 or 9.

Improvement of the high frequency behavior may be obtained without substantial impact on the manufacturing process, since it requires elimination or just dimensional modification of a single implantation mask, and thus at the same costs or even with a reduction of costs, compared to known devices, without requiring any adaptation in the manufacturing process of other possible components in the same die.

Finally, it is clear that modifications and variations may be made to the device and to the manufacturing process described and shown herein, without thereby departing from the scope of the present disclosure.

For instance, in the manufacturing process of the device 100 of FIG. 8, described with reference to FIGS. 13-19, the epitaxial growths represented in FIGS. 17 and 18 may be replaced by a single epitaxial growth of appropriate thickness.

Further, formation of the intermediate regions 230 could be obtained with a different technique and/or using different parameters (different implantation energy and choice of a different doping).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor MOS device, comprising:
a drain region having a first conductivity type;
a plurality of first columns on the drain region, the first columns having a second conductivity type;
a plurality of second columns on the drain region, the second columns having the first conductivity type, each of the second columns being arranged between mutually adjacent pairs of first columns;
a plurality of insulated gate regions respectively arranged on top of the second columns; and
a plurality of body regions, of the second conductivity type, respectively extending above and spaced apart from the first columns.

2. The device according to claim 1, further comprising pairs of source regions having the first conductivity type, each pair of source regions extending within a respective one of the body regions, and the source regions of each pair being on opposite sides of a respective one of the insulated gate regions.

3. The device according to claim 1, further comprising an interruption layer having the first conductivity type and extending between the first columns and the body regions.

4. The device according to claim 3, wherein the drain region, the second columns, and the interruption layer are formed by an epitaxial layer.

5. The device according to claim 4, wherein the interruption layer has a thickness comprised between 4.5 and 7.5 µm.

6. The device according to claim 1, further comprising a plurality of intermediate regions having the second conductivity type, the intermediate regions being respectively arranged, at a distance, between the respective first columns and the respective body regions.

7. The device according to claim 6, wherein each intermediate region is arranged at a same distance from the respective first column and from the respective body region.

8. The device according to claim 6, wherein each intermediate region is arranged at a distance comprised between 1 and 2 µm from the respective first column and from the respective body region.

9. The device according to claim 6, wherein the intermediate regions and top portions of the first columns have the same conductivity level.

10. The device according to claim 6, wherein the intermediate regions have a smaller width than the first columns.

11. A process for manufacturing a power MOS device, comprising:
forming a drain region having a first conductivity type;
forming a plurality of first columns and a plurality of second columns on the drain region, the first columns having a second conductivity type and the second columns having the first conductivity type, the first and second columns alternating with each other;
forming an interruption layer, having the first conductivity type, on the first and second columns;
forming a plurality of body regions having the second conductivity type on the interruption layer, the body regions respectively extending above and at a distance from the first columns; and
forming a plurality of insulated gate regions on the body regions, the insulated gate regions being arranged on top of the second columns, respectively.

12. The process according to claim 11, wherein forming the plurality of first columns and the plurality of second columns comprises growing plural epitaxial sublayers, each having the first conductivity type, and forming successive sets of column portions by introducing column doping ion species of the second conductivity type in the respective epitaxial sublayers, wherein the column portions in each epitaxial sublayer are aligned with respective column portions in others of the epitaxial sublayers.

13. The process according to claim 12, wherein forming the interruption layer comprises epitaxially growing the interruption layer on a topmost one of the epitaxial sublayers.

14. The process according to claim 12, comprising, after epitaxially growing the interruption layer, forming a plurality of intermediate regions having the second conductivity type within the interruption layer, each intermediate region extending between a respective one of the first columns and a respective one of the body regions.

15. The process according to claim 14, wherein the intermediate regions have a smaller width than the first columns.

16. The process according to claim 14, wherein introducing column doping ion species comprises using column masks which have first openings with a first dimension, and wherein forming the plurality of intermediate regions comprises introducing intermediate doping ion species using an intermediate mask having second openings with a second dimension smaller than the first dimension.

17. A class E power amplifier, comprising:
a load network that includes a capacitance and an output circuit in parallel with each other, the output circuit including an LC filter; and
a semiconductor MOS device in parallel with the capacitance and including:
a plurality of insulated gate electrodes positioned on a semiconductor body and spaced apart laterally from each other;
a drain region having a first conductivity type;
a plurality of first columns on the drain region, the first columns having a second conductivity type;
a plurality of second columns on the drain region, the second columns having the first conductivity type, each of the second columns being arranged between mutually adjacent pairs of first columns;
a plurality of insulated gate regions respectively arranged on top of the second columns; and
a plurality of body regions, of the second conductivity type, respectively extending above and spaced apart from the first columns.

18. The power amplifier according to claim 17, wherein the semiconductor MOS device includes an interruption layer having the first conductivity type and extending between the first columns and the body regions.

19. The power amplifier according to claim 17, wherein the semiconductor MOS device includes a plurality of intermediate regions having the second conductivity type, the intermediate regions being respectively arranged, at a distance, between the respective first columns and the respective body region.

20. The power amplifier according to claim 19, wherein the intermediate regions have a smaller width than the first columns.

21. A process for manufacturing a power MOS device, comprising:
forming a drain region having a first conductivity type;
forming a plurality of first columns and a plurality of second columns on the drain region, the first columns having a second conductivity type and the second columns having the first conductivity type, the first and second columns alternating with each other, wherein forming the plurality of first columns and the plurality of second columns includes growing plural epitaxial sublayers, each having the first conductivity type, and forming successive sets of column portions by introducing column doping ion species of the second conductivity type in the respective epitaxial sublayers, wherein the column portions in each epitaxial sublayer are aligned with respective column portions in others of the epitaxial sublayers;
forming an interruption layer, having the first conductivity type, on the first and second columns;
forming a plurality of body regions having the second conductivity type on the interruption layer, the body regions respectively extending above and at a distance from the first columns; and
forming a plurality of insulated gate regions on the body regions, the insulated gate regions being arranged on top of the second columns, respectively.

22. The process according to claim 21, wherein forming the interruption layer comprises epitaxially growing the interruption layer on a topmost one of the epitaxial sublayers.

* * * * *